United States Patent
Kondo

(10) Patent No.: US 11,417,446 B2
(45) Date of Patent: Aug. 16, 2022

(54) LOAD RESISTOR

(71) Applicant: TATSUMI RYOKI CO., LTD, Tokyo (JP)

(72) Inventor: Toyoshi Kondo, Tokyo (JP)

(73) Assignee: TATSUMI RYOKI CO., LTD, Tokyo (JP)

( * ) Notice: Subject to any disclaimer, the term of this patent is extended or adjusted under 35 U.S.C. 154(b) by 0 days.

(21) Appl. No.: 17/276,367

(22) PCT Filed: Oct. 10, 2018

(86) PCT No.: PCT/JP2018/037714
§ 371 (c)(1),
(2) Date: Mar. 15, 2021

(87) PCT Pub. No.: WO2020/059159
PCT Pub. Date: Mar. 26, 2020

(65) Prior Publication Data
US 2022/0037063 A1 Feb. 3, 2022

(30) Foreign Application Priority Data
Sep. 18, 2018 (JP) .............................. JP2018-173230

(51) Int. Cl.
*H01C 1/028* (2006.01)
*H01C 3/14* (2006.01)

(52) U.S. Cl.
CPC .............. *H01C 1/028* (2013.01); *H01C 3/14* (2013.01)

(58) Field of Classification Search
CPC .......... H01C 1/14; H01C 1/084; H01C 13/02; H01C 1/028; H01C 3/14; G01R 1/203; G01R 31/34
See application file for complete search history.

(56) References Cited

U.S. PATENT DOCUMENTS 6,653,928 B1 * 11/2003 Kondo ................... G01R 1/203
338/319
8,878,558 B2 * 11/2014 Kondo ................... G01R 31/40
324/750.01

(Continued)

FOREIGN PATENT DOCUMENTS

JP    2002-333269    11/2002
JP    2005-353627    12/2005

(Continued)

OTHER PUBLICATIONS

WO2018142448, Kondo, machine translation. (Year: 2018).*

(Continued)

*Primary Examiner* — Kyung S Lee
(74) *Attorney, Agent, or Firm* — Wenderoth, Lind & Ponack, L.L.P.

(57) ABSTRACT

The present invention is a load resistor that receives power transmitted from an apparatus and performs an energization test on the apparatus. The load resistor is characterized by comprising a rod-shaped resistive base body that is energized with the power and generates heat, a pipe-shaped protective member through which the rod-shaped resistive base body penetrates, and rod-shaped resistors having an insulation member that are packed in between the rod-shaped resistive base body and the protective member, the rod-shaped resistive base body having used therein a stretched nichrome wire that is wound in the shape of a coil.

5 Claims, 5 Drawing Sheets

(56) References Cited

U.S. PATENT DOCUMENTS

| | | | | |
|---|---|---|---|---|
| 9,488,694 B2* | 11/2016 | Kondo | ................... | G01R 31/40 |
| 9,885,756 B2* | 2/2018 | Kondo | ................... | G01R 31/40 |
| 2016/0252579 A1* | 9/2016 | Kondo | ................... | G01R 31/40 |
| | | | | 324/764.01 |
| 2017/0207010 A1* | 7/2017 | Buckner | ................ | H05K 1/181 |
| 2018/0252773 A1 | 9/2018 | Kondo | | |
| 2019/0326778 A1* | 10/2019 | Kondo | ................... | G01R 31/42 |

FOREIGN PATENT DOCUMENTS

| | | |
|---|---|---|
| JP | 2010-25752 | 2/2010 |
| JP | 2015-87276 | 5/2015 |
| JP | 2017-215223 | 12/2017 |
| WO | 2015/125182 | 8/2015 |
| WO | 2017/145615 | 8/2017 |
| WO | 2018/142448 | 8/2018 |

OTHER PUBLICATIONS

JP2002333269, Nakatani, machine translation. (Year: 2002).*
JP2005353627, Muramoto machine translation. (Year: 2005).*
International Search Report dated Dec. 18, 2018 in International (PCT) Application No. PCT/JP2018/037714.

* cited by examiner

LOAD RESISTOR

TECHNICAL FIELD

The present invention relates to a load resistor that generates heat through an operation test, that is, a load test of, for example, an emergency generator and the like, and relates to, in particular, a load resistor that does not require a large-sized cooling device.

BACKGROUND ART

Recently, the demand for a load resistor that performs an operation test of an emergency generator and the like has sharply risen. The load resistor is used for, for example, a periodic operation test of the emergency generator installed to an office building or a department store, and a normal operation test of a generating device, such as a solar panel or a wind generator.

With a conventional load resistor, there exist actual circumstances in which a plurality of resistor rods arranged in the resistor generate a heat to around 200° C. by an electric power supplied from, for example, an emergency generator and rises up to 400° C. to 600° C. in an agglomerate of the resistor rods.

Therefore, in order to cool down the heat generation temperature and ensure a safety of the load resistor itself and its surrounding safety, it has been necessary to be formed such that a large-sized cooling device is always installed to for example, a lower portion of the load resistor to cool the plurality of resistor rods by blowing wind upward from below.

However, since the large-sized cooling device constituted by a cooling fan and the like is considerably heavy, additionally, has also a large capacity, and occupies approximately a half of a weight and approximately a lower half of a capacity that constitute the load resistor, it has been demanded to ensure measures against heat of the resistor rod and reduction in size and weight of the cooling device that cools the heat-generated resistor rod.

Patent Document 1: Japanese Unexamined Patent Application Publication No. 2010-25752

DISCLOSURE OF THE INVENTION

Problems to be Solved by the Invention

Thus, the present invention has been created in consideration of the conventional demands, conventional proposals, and current social trends, and an object of the present invention is to provide a load resistor where a plurality of resistor rods arranged inside the load resistor generates heat at only approximately 100° C. or less by an electric power supplied from, for example, an emergency generator, furthermore the heat is rapidly cooled by merely exposing these resistor rods to air, and then an installation of a cooling device that forcibly cools the resistor rods is not required. Therefore, the load resistor does not require a cooling fan having a considerably heavy weight and also having a large capacity to occupy approximately a half of a weight and approximately a lower half of a volume that constitute the load resistor.

Solutions to the Problems

The present invention is a load resistor that receives an electric power transmitted from a device and performs an energization test of the device, the load resistor including:

a rod-shaped resistor body that includes:

a rod-shaped resistor base body configured to be energized by the electric power to generate a heat;

a pipe-shaped protecting material through which the rod-shaped resistor base body is inserted; and an insulating member filled between the rod-shaped resistor base body and the protecting material, wherein the rod-shaped resistor base body employs a nichrome wire having been wound into a coil form and then stretched.

Alternatively, the present invention is a load resistor that receives an electric power transmitted from a device and performs an energization test of the device, the load resistor including:

a rod-shaped resistor body that includes:

a rod-shaped resistor base body configured to be energized by the electric power to generate a heat;

a pipe-shaped protecting material through which the rod-shaped resistor base body is inserted; and an insulating member filled between the rod-shaped resistor base body and the protecting material, wherein the rod-shaped resistor base body employs a nichrome wire having been wound into a coil form and then stretched to be doubled or more.

Alternatively, the present invention is a load resistor that receives an electric power transmitted from a device and performs an energization test of the device, the load resistor including:

a rod-shaped resistor body that includes:

a rod-shaped resistor base body configured to be energized by the electric power to generate a heat;

a pipe-shaped protecting material through which the rod-shaped resistor base body is inserted; and an insulating member filled between the rod-shaped resistor base body and the protecting material, wherein the rod-shaped resistor base body employs a linearly formed iron-chrome wire in which a nickel amount of a nichrome wire is reduced by replacing a nickel chrome amount with several tens of percent of an iron amount.

Alternatively, the present invention includes a resistor box formed to have an approximately square shape, to which a plurality of rod-shaped resistor bodies configured using the rod-shaped resistor base bodies are mounted, so as to enable the plurality of rod-shaped resistor bodies to be coupled in parallel and in series, the plurality of rod-shaped resistor bodies are mounted to an upper side part from an approximately intermediate position in a longitudinal direction inside the resistor box having the approximately square shape, and a space portion is disposed in a lower side part from the approximately intermediate position in the longitudinal direction, and a plurality of the resistor boxes are laterally couplable and/or longitudinally couplable so as to enable a load test of the device having a different electric power delivery capacity.

Alternatively, the present invention includes a resistor box formed to have an approximately square shape, to which a plurality of rod-shaped resistor bodies configured using the rod-shaped resistor base bodies are mounted, so as to enable the plurality of rod-shaped resistor bodies to be coupled in parallel and in series, the plurality of rod-shaped resistor bodies are mounted to an upper side part from an approximately intermediate position in a longitudinal direction inside the resistor box having the approximately square shape, and a space portion is disposed in a lower side part from the approximately intermediate position in the longitudinal direction, a plurality of the resistor boxes are laterally couplable and/or longitudinally couplable so as to enable a load test of the device having a different electric power delivery capacity, and a fan device that flows air in an up-down direction is mounted to the resistor box space portion arranged at an approximately intermediate position in a height direction of the longitudinally coupled resistor boxes.

Alternatively, in the present invention, the fan device is mountable to the space portion of the resistor box arranged at any position.

Alternatively, in the present invention, the plurality of rod-shaped resistor bodies are mounted in the resistor box to be oriented in a lateral direction of the resistor box, and an operating unit is installable on a surface in a front-rear direction of the resistor box, and the resistor box is configured to be movable back and forth at inspection or failure of the resistor box to enable the inspection or work at the failure.

Alternatively, the present invention includes a caster mounted to the resistor box travels on a rail to move the resistor box back and forth.

Effects of the Invention

With the present invention, the plurality of resistor rods arranged inside the resistor generates heat at only approximately 100° C. or less even by an electric power supplied from, for example, an emergency generator, and then a large-sized cooling device that forcibly cools the heat is not required. Therefore, the present invention provides an excellent effect in which the cooling device constituted by a cooling fan and the like is not required. The cooling fan has a considerably heavy weight and also has a large capacity to occupy approximately a half of a weight and approximately a lower half of a volume that constitute the load resistor.

BEST MODE FOR CARRYING OUT THE INVENTION

Figure 1:
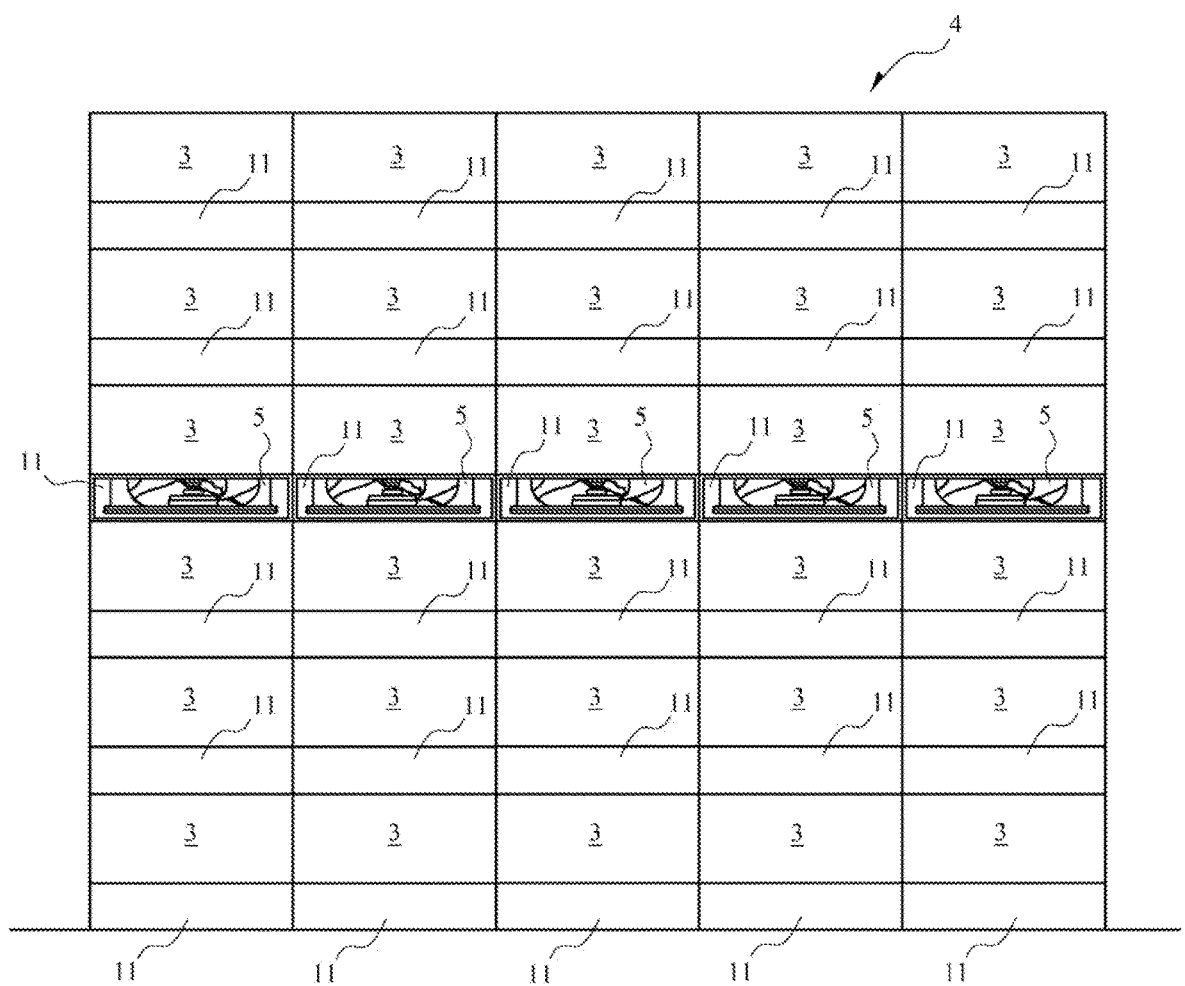
FIG. 1 is a configuration explanatory drawing (1) that describes a configuration of a load resistor according to the present invention.

The drawings illustrate embodiments of the present invention.

First, the present invention is a load resistor 4 that receives an electric power transmitted from a device and performs an energization test of the device, and the load resistor 4 relates to a rod-shaped resistor body 2 that includes: a rod-shaped resistor base body 1 configured to be energized by the electric power to generate a heat; a pipe-shaped protecting material 9 through which the rod-shaped resistor base body 2 is inserted; and an insulating member 8 filled between the rod-shaped resistor base body 1 and the protecting material 9. The rod-shaped resistor base body 1 employs a nichrome wire having been wound into a coil form and then stretched.

Then, an example that employs a nichrome wire having been wound into a coil form and then stretched to be doubled or more is illustrated.

Furthermore, the present invention employs a linearly formed iron-chrome wire in which a nickel amount of the nichrome wire for the rod-shaped resistor base body 1 is reduced by replacing a nickel chrome amount with several tens of percent of an iron amount.

Here, when an experiment that changes a type of a heating wire, such as the nichrome wire configured to be energized by electricity, and a current and a voltage of the electricity for energizing is performed, it is found that an electric heat is proportionate to the product of the voltage and the current. Furthermore, it can be understood that the electric heat is also proportionate to the product of the square of the current and an electrical resistance from Ohm's law.

This is accurately expressed by the formula of heat generation amount=0.24×voltage×current×time=0.24×(current)$^2$×resistance×time.

This formula is referred to as Joule's laws, and the electric heat is referred to as Joule heat. This denies the theory at that time that heat was a substance and concludes the theory that heat is an ability to perform work (energy).

Conventionally, an energization test for confirming whether a generator, such as an emergency generator, normally operates or not has been performed while the generator is operated to generate electricity, and the generated electric power energizes a load resistor.

Then, a heating wire inside a resistor rod constituting the load resistor is constituted by using a commonly used heating wire, that is, a nichrome wire wound into a coil form.

The nichrome wire is an alloy obtained by being mixed at, for example, a ratio of nickel of 80 to chrome of 20. This nichrome wire is configured to be wound into a coil form as described above, an electric power energizes it, and it is used as a dummy load.

Here, the reason why the nichrome wire is wound into a coil form is to locally obtain a heat generation amount of heat generated from the nichrome wire in a concentrated manner, so as to maximally make the locally and concentratedly obtained heat generation temperature available as a heat energy.

That is, a nichrome wire amount per unit space is increased, furthermore, a convective flow of air is partially inhibited, and thus a high temperature easily occurs. Furthermore, when being into a coil form, what is called, a heat generating unit is congested, a resistance value becomes high, which reduces the current that flows as a result, and it is advantageous that a power consumption is reduced.

However, in a field of use of the load resistor, in a heating element used for the resistor rod of the load resistor, it can be said that there is no necessity of using the nichrome wire wound into a coil form at all.

This is because when the nichrome wire wound into a coil form is used as the dummy load inside the resistor rod of the load resistor, the nichrome wire wound into a coil form generates heat, which results in a rapid temperature rise, and cooling control must be forcibly performed on this temperature rise.

Therefore, conventionally, the nichrome wire wound into a coil form was inserted into the pipe-shaped protecting material 9 while interposing the powdery insulating member 8 in a peripheral area thereof to form the rod-shaped resistor body 2, or a plurality of fins 10 for heat release were disposed in an outer periphery of the pipe-shaped protecting material 9.

Further, it has been necessary that a large-sized cooling fan has been installed on a lower side on which a plurality of rod-shaped resistor bodies 2 are installed to forcibly blow wind upward, so as to cool down the heat generation temperature of the nichrome wire wound into a coil form.

Thus, first, the present inventor has corrected a state where the used nichrome wire is wound into a coil form, thus resolving it.

The heating wire inside the rod-shaped resistor body 2 constituting the load resistor does not need to locally and concentratedly obtain the heat generation amount of the generated heat or maximally make the locally and concentratedly obtained heat generation temperature available as the heat energy. Conversely, it is preferred that the heat generation amount is small, and furthermore, it is preferred that a proximity temperature of a heat generation portion is promptly lowered.

Therefore, the present inventor has created the nichrome wire that is wound into a coil form and then stretched to have at least twice or more the length in the state of being wound in the coil form, and that is used as the heating wire that serves as the heating element.

Figure 3:
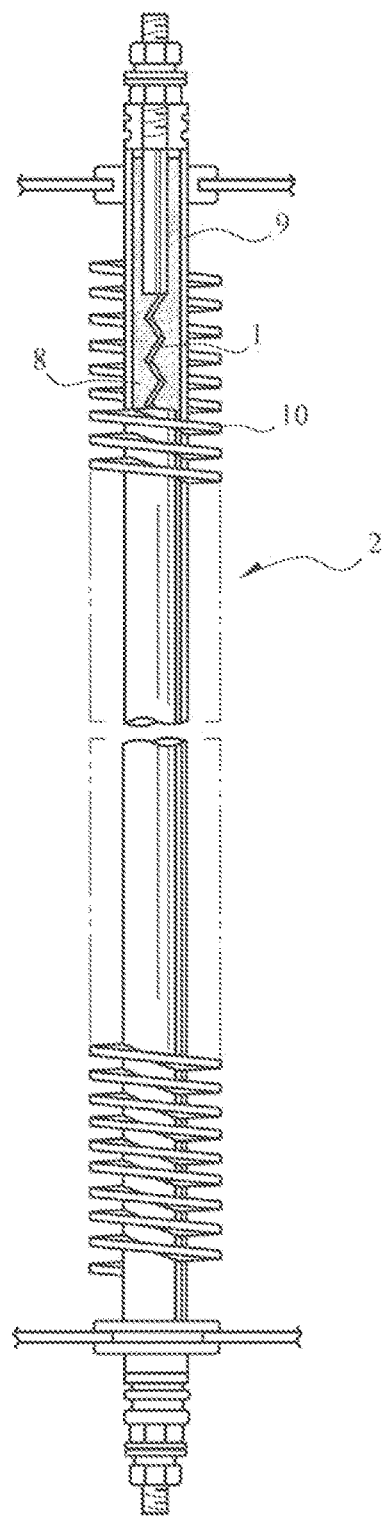
FIG. 3 is an explanatory drawing (1) that describes a configuration of a rod-shaped resistor base body according to the present invention.
Figure 4:
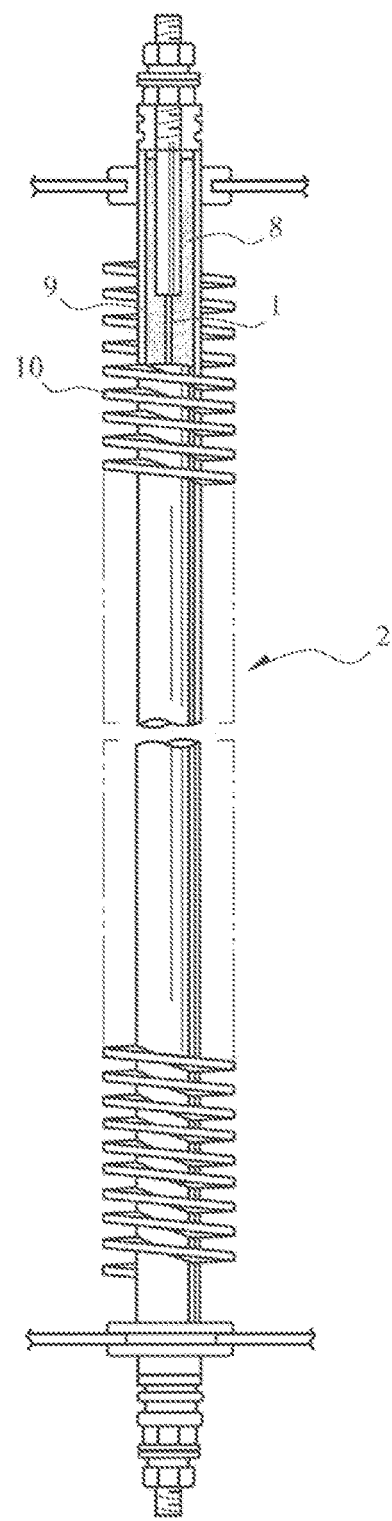
FIG. 4 is an explanatory drawing (2) that describes a configuration of the rod-shaped resistor base body according to the present invention.
Figure 5:
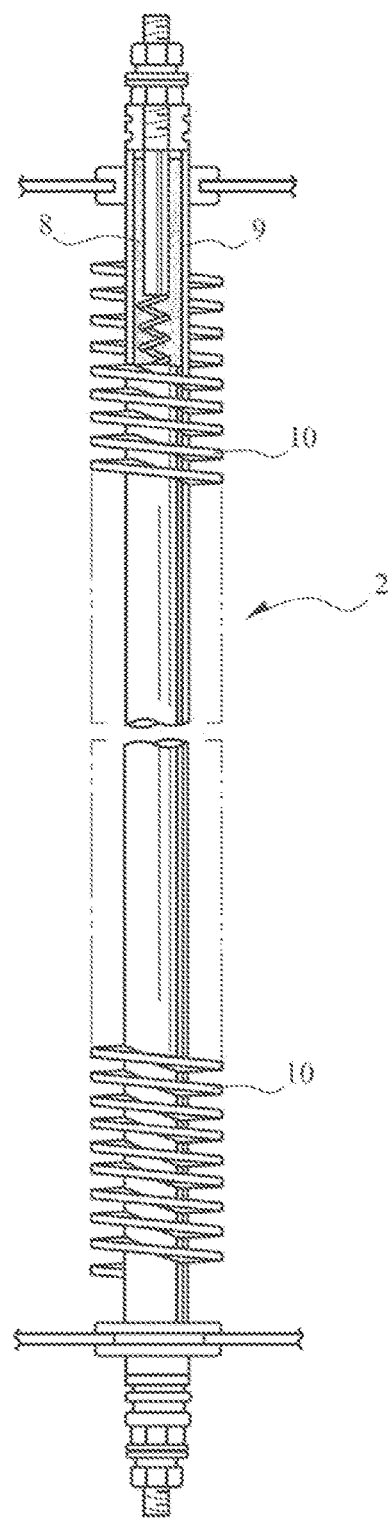
FIG. 5 is an explanatory drawing that describes a configuration of a conventional rod-shaped resistor base body.

The following describes the embodiments of the present invention with reference to FIG. 3.

The reference numeral 1 denotes the rod-shaped resistor base body formed by the present invention. The rod-shaped resistor base body 1 is configured such that a conventional nichrome wire is, for example, pulled to be stretched, so as to have at least twice or more the length at the time of being wound in the coil form.

That is, for example, the heating wire, such as a nichrome wire having a wire diameter of 1.2 mm, is wound into a coil form and then the one having a whole length of 600 mm is prepared. Then, the nichrome wire wound in the coil form is formed to have twice or more its length, for example, a length of 1200 mm or more, so as to form the rod-shaped resistor base body 1 as the heating element.

A cross-sectional shape of the rod-shaped resistor base body 1 may be not only a circular shape but also an oval shape, a square shape, such as a quadrilateral shape and a pentagonal shape, or a band plate shape. A cross-sectional shape where the heat generation temperature is lowered at the time of the energization, that is, one having a wide surface area is selected. Accordingly, in order to expand an outer periphery of the surface area, an outer peripheral surface may be configured such that it has, what is called, a star shape.

When a current of 20 A was flowed into this rod-shaped resistor base body 1 stretched to have twice or more the length, the temperature rose to only a low temperature of approximately 68° C., which was recognized at a proximity of an outer periphery of the rod-shaped resistor base body 1, and a proximity temperature of the outer periphery was confirmed to be extremely lowered after the heat generation.

That is, it was found that the generated heat rapidly escaped outside when the nichrome wire wound into the coil form was extended long and then the surface area including a space was increased. In other words, it was found that the heat release effect was extremely and properly exerted.

Furthermore, when this rod-shaped resistor base body 1 into which the current of 20 A was flowed was exposed to the wind from outside, the temperature rose to only a low temperature of approximately 40° C., which was recognized at the proximity of the outer periphery of the rod-shaped resistor base body 1.

That is, without exposing the rod-shaped resistor base body 1 to the wind forcibly sent by using the large-sized cooling fan or the like as in a conventional manner, air oscillation was recognized outside the energized rod-shaped resistor base body 1. When the outer periphery of the rod-shaped resistor base body 1 was exposed to the wind by the oscillating air, the proximity temperature of the outer periphery of the rod-shaped resistor base body 1 was confirmed to be further decreased due to an influence of the wind.

Furthermore, the inventor inserted the rod-shaped resistor base body 1 having twice or more the length formed by pulling and extending the heating element formed from the above-described nichrome wire, which was wound into a coil form, into a pipe having a diameter of 12 mm made of SUS, that is, the protecting material 9. The inventor filled a space between the rod-shaped resistor base body 1 and an inner peripheral surface of the SUS pipe with the insulating member 8, such as magnesium oxide, to form the rod-shaped resistor body 2.

Then, when the current of 20 A was flowed into this rod-shaped resistor body 2, a temperature detection of a low temperature of only approximately 40° C. was recognized at a proximity of an outer periphery of the rod-shaped resistor body 2.

Furthermore, when wind was sent to this rod-shaped resistor body 2 from outside, a proximity temperature of the outer periphery of the rod-shaped resistor body 2 was confirmed to be decreased to a low temperature of approximately 31° C.

Without forcibly blowing wind to the rod-shaped resistor body 2 by using the large-sized cooling fan or the like as in a conventional manner, air oscillated outside the energized rod-shaped resistor base body 1. When the outer periphery of the rod-shaped resistor base body 1 was exposed to the wind by the oscillating air, the temperature of the rod-shaped resistor base body 1 was confirmed to be further decreased due to an influence of the wind.

Furthermore, the present inventor performed an experiment on the rod-shaped resistor body 10 that employs a conventional nichrome wire wound into a coil form.

That is, the rod-shaped resistor base body 10 was formed by winding a conventional heating wire whose material is a nickel chrome heating wire (reference numeral: NCHW1) and which has a conductor resistance of approximately 40 ($\Omega$/m) and a wire diameter of 1.2 mm into a coil form to have a whole length of 600 mm.

Then, the rod-shaped resistor base body 1 constituted of the above-described configuration was inserted into a pipe having a diameter of 12 mm, that is, a pipe that includes the heat releasing fin 10 mounted to an outer peripheral surface of the protecting material 9 and is made of SUS. A magnesium oxide as the insulating member 8 was filled between the nichrome heating wire and an inner peripheral surface of the pipe made of SUS to form the rod-shaped resistor body 2. It was a conventional rod-shaped resistor body 2. The current of 20 A was flowed into this rod-shaped resistor body 2.

Then, in the rod-shaped resistor base body 1, a temperature detection of approximately 200° C. was recognized, its proximity temperature of the outer periphery rose to approximately 200° C., which was also recognized.

Furthermore, it rose to 400° C. to 600° C. at a proximity of an agglomerate periphery of the rod-shaped resistor bodies 2.

Thus, when through the load resistor tests, the proximity temperature of the outer periphery of the rod-shaped resistor body 2 becomes a high temperature of 200° C. or higher and it rises to 400° C. to 600° C. at the proximity of their agglomerate periphery, a large-sized cooling device that cools the rod-shaped resistor body 2 must be disposed in order to cool down this heat generation temperature. However, the cooling device has a heavy weight and a large capacity, which leads to a heavy weight of a load resistor itself that becomes large-sized.

In contrast, since use of the rod-shaped resistor base body 1 of the present invention does not need to forcibly cool the rod-shaped resistor base body 1, the load resistor without requiring a large-sized cooling device can be provided.

Next, the present inventor reduced the nickel amount in the nichrome wire to be replaced with iron (around several tens of percent), so as to obtain the iron-chrome wire. The present inventor formed it in a linear state, and used it as the heating wire inside the resistor rod of the load resistor. This also suppresses a heat generation of a conventional resistor rod to be approximately 100° C. or less, and thus the installation of the large-sized cooling device is not required.

In this embodiment, an example of the rod-shaped resistor base body includes the linear rod-shaped resistor base body 1 having a wire diameter of 5.5 mm and a length of 600 mm that is formed by using an iron-chrome heating wire (reference numeral FCHW1•No. 30) as its material.

When the rod-shaped resistor base body constituted by the iron-chrome heating wire has the wire diameter of 5.5 mm, its conductor resistance is an extremely low resistance of 0.0598 (Ω/m).

Thus, the present inventor inserted the linear rod-shaped resistor base body 1 having a wire diameter of 5.5 mm and a length of 600 mm, which is formed by using the iron-chrome heating wire (reference numeral FCHW1•No. 30) as its material, into the pipe having the diameter of 12 mm made of SUS, that is, the protecting material 9. The present inventor filled a space between the iron-chrome heating wire and an inner peripheral surface of the SUS pipe with magnesium oxide as the insulating member 8 to form the rod-shaped resistor body 2.

When the current of 20 A was flowed into this rod-shaped resistor body 2, a temperature detection of a low temperature of only approximately 40° C. was recognized at the rod-shaped resistor body 2.

Furthermore, when the current of 20 A was flowed into this rod-shaped resistor body 2, and wind was sent to this from outside, the temperature of the rod-shaped resistor body 2 was confirmed to be decreased to a low temperature of approximately 31° C. Without forcibly blowing wind to the rod-shaped resistor body 2 by using a cooling fan or the like as in a conventional manner, air oscillated outside the energized rod-shaped resistor base body 1. When the outer periphery of the rod-shaped resistor base body 1 was exposed to the wind by the oscillating air, the temperature of the rod-shaped resistor base body 1 was confirmed to be further decreased due to an influence of the wind.

Next, the load resistor 4 formed by using the rod-shaped resistor base body 1 according to the present invention is described.

As understood from the drawings, the resistor box 3 to which the plurality of rod-shaped resistor bodies 2 configured using the rod-shaped resistor base bodies 1 are mounted, so as to enable the plurality of rod-shaped resistor bodies 2 to be coupled in parallel and in series, is formed to have an approximately square shape.

Then, the plurality of rod-shaped resistor bodies 2 are mounted to an upper side part from an approximately intermediate position in a longitudinal direction inside the resistor box 3 having the approximately square shape. A space portion 11 is disposed in a lower side part from the approximately intermediate position in the longitudinal direction.

Here, in the present invention, a plurality of the resistor boxes 3 are couplable in a lateral direction and can be stacked to be couplable also in the longitudinal direction.

As described above, coupling in the lateral direction and the longitudinal direction enables a load test of the device having a different electric power delivery capacity to be performed with one load resistor 4.

Furthermore, a fan device 5 that flows air in an up-down direction is mounted to the space portion 11 of the resistor box 3 arranged at an approximately intermediate position in a height direction of a group of the resistor boxes 3 stacked to be coupled in the longitudinal direction.

Furthermore, the plurality of rod-shaped resistor bodies 2, which are mounted in the resistor box 3, are mounted to be oriented in the lateral direction of the resistor box 3, that is, a right-left direction, and then an operating unit projecting outside, such as a control device 6, is installable on a surface in a front-rear direction of the resistor box 3, which enables an operator to easily operate the load resistor 4 of the present invention.

Furthermore, it is configured such that the resistor box 3 can be moved back and forth, and inspection or work at a failure can be easily performed when the inspection of each of the resistor boxes 3 constituting the load resistor 4 is required or when each of the resistor boxes 3 has a failure.

Figure 2:
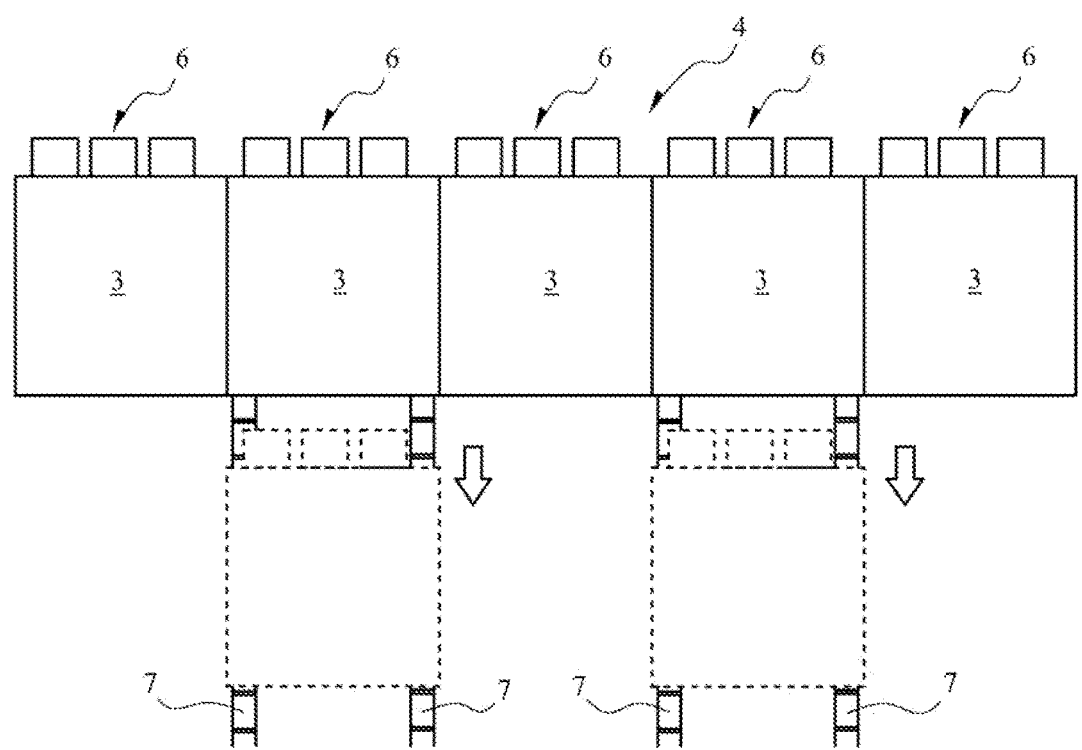
FIG. 2 is a configuration explanatory drawing (2) that describes a configuration of the load resistor according to the present invention.

Thus, as illustrated in FIG. 1 and FIG. 2, the plurality of rod-shaped resistor bodies 2 formed by using the rod-shaped resistor base bodies 1 of the present invention are arranged inside one box-shaped box having an approximately square shape to form the resistor box 3.

For example, ten rod-shaped resistor bodies 2 formed from the configuration of the present invention are arranged in one resistor box 3 to form the one resistor box 3.

A current of 15 V and 10 A can energizes the one rod-shaped resistor body 2. Accordingly, connecting the ten rod-shaped resistor bodies 2 in parallel can form the resistor box 3 having a load of 15 V and 100 A. Then, connecting thirty of these resistor boxes 3 in series can form a load of 450 V and 100 A, and the load resistor 4 that can perform an electric power test of the load can be formed. Additionally, connecting the thirty resistor boxes 3 in parallel can form the load resistor 4 that can perform an electric power test of 15 V and 3000 A.

As understood from FIG. 1 and FIG. 2, the thirty resistor boxes 3 are stacked on five rows in the lateral direction and six stages in the longitudinal direction to configure the load resistor 4.

Here, the number of the resistor boxes 3 is not limited to thirty, and it can be changed corresponding to a situation of the load test.

Moreover, compared with a conventional load resistor, the configuration where a proximity temperature of a periphery of the load resistor 4 during the load test rises to only around 60° C. is employed. Furthermore, blowing wind to the load resistor 4 can further decrease the temperature.

FIG. 1 and FIG. 2 illustrate specific examples where the thirty resistor boxes 3 are assembled to configure a predetermined load resistor 4, and each of the resistor boxes 3 is formed to have a shape of an approximately quadrilateral body. Then, the ten rod-shaped resistor bodies 2 are mounted to the upper side part of this resistor box 3 at intervals to form a plurality of stages. These rod-shaped resistor bodies 2 are mounted to have their longer side direction oriented in the lateral direction, that is, the right-left direction.

Additionally, it is configured such that the lower side parts of the resistor boxes 3 are configured as the respective space portions 11 into which wind flows, air is introduced into the space portions 11, and the air can oscillate inside the space portions 11.

In the resistor box 3 having the shape of the approximately quadrilateral body, while a volume ratio of the upper side part, in which the rod-shaped resistor bodies 2 are mounted, to the space portion 11, as the lower side part that serves as an introduction part of the air and an oscillation part, is not limited at all, it is designed to have a volume ratio satisfying that at least the upper side part to which the plurality of rod-shaped resistor bodies 2 are mounted is equal to or more than a half of the resistor box 3.

Here, the space portions 11 as the lower side parts also each serve as a space to which the small-sized fan device 5 is mounted. As illustrated in the drawing, the small-sized fan device 5 has a shape of a quadrilateral body and is configured to blow wind in the up-down direction.

FIG. 1 is a drawing where the fan device 5 is mounted to the resistor box 3 at the third stage from the top in the load resistor 4 configured by stacking the resistor boxes 3 to form the six stages.

Nevertheless, in the load resistor 4, which stage and which row of the resistor box 3 the fan device 5 of the present invention is mounted is not limited at all.

Based on any condition including a condition, for example, an output voltage and an output electric power capacity of the device, such as the generator, which performs the load test, a condition of a test place, or a temperature of the test place, any stage and any row of the resistor boxes 3 can be selected to mount the fan device 5 of the present invention.

When the load resistor 4 in FIG. 1 operates, and at the operation phase, a heat generation temperature of the resistor box 3 at the lowest stage illustrated in the drawing is approximately 30° C., the resistor box 3 at the second stage is expected to be approximately 40° C., and the resistor box 3 at the third stage is expected to be approximately 50° C. Then, the fan device 5 is mounted to the space portion of the resistor box 3 at the fourth stage.

Consequently, the resistor box 3 at the fourth stage to which the fan device 5 is mounted is cooled and has a decreased temperature of about 60° C. While the temperature further rises to approximately 80° C. when the fan device 5 is not mounted, the resistor box 3 at the fourth stage is cooled and the temperature is decreased to about 60° C. as described above when the fan device 5 is mounted.

Additionally, the temperature of the resistor box 3 at the fifth stage thereon becomes about 70° C., and the temperature of the resistor box 3 at the sixth stage rises to only about 80° C. In contrast, when the fan device 5 is not mounted, the temperature of the resistor box 3 at the fifth stage becomes about 100° C., and the temperature of the resistor box 3 at the sixth stage rises to about 150° C.

Thus, the upper the stage is, the higher the temperature of the resistor body rises. Therefore, it is extremely effective to install the fan device 5 at an intermediate stage. This is because the wind drawn by the fan device 5 cools the resistor box 3 positioned on a side lower than the stage on which the fan device 5 is installed, and the pushing wind of the fan device 5 cools the resistor box 3 positioned on a side upper than the stage on which the fan device 5 is installed. That is, the wind of the fan device 5 generated in the up-down direction can be used for the cool action without any waste.

In contrast, for example, when the fan device 5 is installed at the lowest stage position of the load resistor 4, the wind probably reaches up to only the resistor box 3 at the third stage or the fourth stage. This is because a fan having a large diameter cannot be used for such a small-sized fan device 5 and therefore its air output is small.

However, for example, when the fan device 5 is installed at the intermediate position, such as the resistor box 3 at the fourth stage, the wind exits from an upper portion of the resistor box 3 at the sixth stage to outside, and a force of the wind can cool the resistor box 3 at the fourth stage, the fifth stage, and the sixth stage, and additionally, the drawing force of the wind can cool the resistor box 3 at the stage lower than the intermediate position.

Therefore, the temperature of the load resistor 4 configured in accordance with the present invention does not surely rise to 100° C. or more. Even when the load test can be performed only in a closed room, the load test can be performed in safety.

FIG. 2 illustrates the load resistor 4 according to the present invention in a plan view. The plurality of resistor boxes 3 are stacked to form the six stages and are lined up in the five rows.

Then, the ten rod-shaped resistor bodies 2 are mounted in the resistor box 3 to be oriented in the lateral direction, that is, the right and left column direction. The plurality of rod-shaped resistor bodies 2 are mounted at intervals in parallel in the front-rear direction of the resistor box 3.

Thus, when the rod-shaped resistor bodies that internally house the rod-shaped resistor base bodies 1 are mounted to be oriented in a column direction at intervals in parallel in the front-rear direction of the resistor box 3, a mounting space where, for example, the control device 6 is mounted to a rear surface or a front surface of the load resistor 4 can be secured, which is extremely efficient.

In the load resistor 4 having such a configuration, in order to deal with a case where a failure of the rod-shaped resistor body 2 occurs and a case where a wiring problem occurs in, for example, the rod-shaped resistor body 2 configured by housing the rod-shaped resistor base body 1, the resistor box 3 is configured such that the resistor box 3 is movable in the front direction or the rear direction. Such a configuration allows smooth dealing with a replacement work due to the failure of the rod-shaped resistor body 2 and a wiring trouble.

Here, the configuration where the resistor box 3 moves in the front direction or the rear direction is not limited at all. For example, a configuration where a rail 7 is disposed in the front direction or the rear direction, and a caster of the resistor box 3 is placed on this rail 7 to be smoothly movable, and similar configuration is considered.

In the example of FIG. 2, the load resistor 4 formed to have the five rows may be configured to move only the second row and the fourth row from the left back and forth. It is not necessary to be configured to move all the rows back and forth.

This is because even when a failure occurs at, for example, the first row from the left, a repair work can be performed by entering a clearance formed by moving the second row.

Next, even when a failure occurs at the third row from the left, a repair work at the third row can be performed by entering a clearance formed by moving the second row or a clearance formed by moving the fourth row.

Furthermore, even when a failure occurs at the fifth row from the left, a repair work at the fifth row can be performed by entering a clearance formed by moving the fourth row.

DESCRIPTION OF REFERENCE SIGNS

1 Rod-shaped resistor base body
2 Rod-shaped resistor body
3 Resistor box
4 Load resistor
5 Fan device
6 Control device
7 Rail
8 Insulating member
9 Protecting material
10 Fin for heat release
11 Space portion

The invention claimed is:

1. A load resistor that receives an electric power transmitted from a device and performs an energization test of the device, the load resistor comprising:
   a rod-shaped resistor body that includes: a rod-shaped resistor base body configured to be energized by the electric power to generate a heat a pipe-shaped protecting material through which the rod-shaped resistor base body is inserted; and an insulating member filled between the rod-shaped resistor base body and the protecting material, wherein the rod-shaped resistor base body employs a nichrome wire having been wound into a coil form and then stretched; and
   a resistor box formed to have an approximately square shape, to which a plurality of the rod-shaped resistor bodies configured using the rod-shaped resistor base bodies are mounted, so as to enable the plurality of rod-shaped resistor bodies to be coupled in parallel and in series, wherein
   the plurality of rod-shaped resistor bodies are mounted to an upper side part from an approximately intermediate position in a longitudinal direction inside the resistor box having the approximately square shape, and a space portion is disposed in a lower side part from the approximately intermediate position in the longitudinal direction, and
   a plurality of the resistor boxes are laterally couplable and/or longitudinally couplable so as to enable a load test of the device having a different electric power delivery capacity.

2. The load resistor according to claim 1, wherein
   the plurality of rod-shaped resistor bodies are mounted in the resistor box to be oriented in a lateral direction of the resistor box, and an operating unit is installable on a surface in a front-rear direction of the resistor box, and
   the resistor box is configured to be movable back and forth at inspection or failure of the resistor box to enable the inspection or work at the failure.

3. The load resistor according to claim 2, comprising
   a caster mounted to the resistor box travels on a rail to move the resistor box back and forth.

4. A load resistor that receives an electric power transmitted from a device and performs an energization test of the device, the load resistor comprising:
   a rod-shaped resistor body that includes: a rod-shaped resistor base body configured to be energized by the electric power to generate a heat a pipe-shaped protecting material through which the rod-shaped resistor base body is inserted; and an insulating member filled between the rod-shaped resistor base body and the protecting material, wherein the rod-shaped resistor base body employs a nichrome wire having been wound into a coil form and then stretched; and
   a resistor box formed to have an approximately square shape, to which a plurality of the rod-shaped resistor bodies configured using the rod-shaped resistor base bodies are mounted, so as to enable the plurality of rod-shaped resistor bodies to be coupled in parallel and in series, wherein
   the plurality of rod-shaped resistor bodies are mounted to an upper side part from an approximately intermediate position in a longitudinal direction inside the resistor box having the approximately square shape, and a space portion is disposed in a lower side part from the approximately intermediate position in the longitudinal direction,
   a plurality of the resistor boxes are laterally couplable and/or longitudinally couplable so as to enable a load test of the device having a different electric power delivery capacity, and
   a fan device that flows air in an up-down direction is mounted to the resistor box space portion arranged at an approximately intermediate position in a height direction of the longitudinally coupled resistor boxes.

5. The load resistor according to claim 4, wherein
   the fan device is mountable to the space portion of the resistor box arranged at any position.

* * * * *